(12) United States Patent
Hartwell (10) Patent No.: US 11,802,041 B2
(45) Date of Patent: *Oct. 31, 2023

(54) ON-CHIP SIGNAL PATH WITH ELECTRICAL AND PHYSICAL CONNECTION

(71) Applicant: INVENSENSE, INC., San Jose, CA (US)

(72) Inventor: Peter George Hartwell, Menlo Park, CA (US)

(73) Assignee: InvenSense, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/689,584

(22) Filed: Mar. 8, 2022

(65) Prior Publication Data

US 2022/0185657 A1 Jun. 16, 2022

Related U.S. Application Data

(63) Continuation of application No. 16/717,660, filed on Dec. 17, 2019, now Pat. No. 11,299,393.

(51) Int. Cl.
*B81B 7/00* (2006.01)
(52) U.S. Cl.
CPC .................... *B81B 7/007* (2013.01)
(58) Field of Classification Search
CPC ... B81B 7/007; B81B 2207/098; H01L 23/48; H01L 23/4824; H01L 23/25
See application file for complete search history.

(56) References Cited

U.S. PATENT DOCUMENTS

| | | | |
|---|---|---|---|
| 9,379,089 B2 | 6/2016 | Yang | |
| 9,726,689 B1 | 8/2017 | Desai | |
| 11,299,393 B2 * | 4/2022 | Hartwell | B81B 7/007 |
| 2011/0006381 A1 | 1/2011 | Feiertag | |
| 2015/0259195 A1 | 9/2015 | Lo | |
| 2016/0016789 A1 | 1/2016 | Yu et al. | |
| 2016/0264402 A1 | 9/2016 | Yu | |
| 2016/0325984 A1 | 11/2016 | Dueweke | |
| 2017/0217767 A1 | 8/2017 | Gudeman | |
| 2021/0179420 A1 | 6/2021 | Hartwell | |

FOREIGN PATENT DOCUMENTS

DE 102007058951 6/2009
EP 2797113 10/2014

OTHER PUBLICATIONS

International Search Report and Written Opinion for International Application No. PCT/US2020/063443, dated Mar. 25, 2021 (14 pages).

* cited by examiner

*Primary Examiner* — Herve-Louis Y Assouman
(74) *Attorney, Agent, or Firm* — Van Hoven PC; Joshua Van Hoven (57) ABSTRACT

An exemplary microelectromechanical system (MEMS) device comprises a plurality of stacked layers, including at least one layer that includes micromechanical components that respond to a force to be measured. Two of the layers may include respective first and second external electrical connection points. A plurality of conductive paths may be disposed in a continuous manner over an external surface of each of the plurality of layers between the first and second external electrical connection points.

20 Claims, 5 Drawing Sheets

ON-CHIP SIGNAL PATH WITH ELECTRICAL AND PHYSICAL CONNECTION

CROSS-REFERENCE TO RELATED APPLICATIONS

This application is a continuation of U.S. patent application Ser. No. 16/717,660, filed Dec. 17, 2019 (now allowed), the disclosure of which is hereby incorporated by reference herein in its entirety.

BACKGROUND

Numerous items such as smartphones, smart watches, tablets, automobiles, aerial drones, appliances, aircraft, exercise aids, and game controllers utilize sensors during their operation (e.g., motion sensors, pressure sensors, temperature sensors, etc.). In commercial applications, microelectromechanical (MEMS) devices or sensors such as accelerometers and gyroscopes capture complex movements and determine orientation or direction. For example, smartphones are equipped with accelerometers and gyroscopes to augment navigation systems that rely on Global Position System (GPS) information. In another example, an aircraft determines orientation based on gyroscope measurements (e.g., roll, pitch, and yaw) and vehicles implement assisted driving to improve safety (e.g., to recognize skid or roll-over conditions).

As ever more products incorporate MEMS technology for a wide variety of applications, MEMS devices must integrate with numerous form factors and in miniaturized devices. A MEMS device may typically include numerous components and systems such as microelectromechanical components, analog and digital circuitry, and other associated processing circuitry for calculating outputs based on signals associated with the microelectromechanical components. In addition, these components need to be protected from the external environment, packaged, and interconnected with other components. The resulting MEMS device, although extremely small, may take up valuable space within the end-use device.

SUMMARY

In some embodiments of the present disclosure, a microelectromechanical (MEMS) device may comprise a first layer, a second layer, and a third layer coupled between the first layer and the second layer, wherein the third layer comprises one or more MEMS components. The MEMS device may further comprise a first plurality of electrical connection points located at an external surface of the first layer and a second plurality of electrical connection points located at an external surface of the second layer. The MEMS device may further comprise a plurality of conductive paths, wherein each conductive path provides a continuous portion of material between one of the first plurality of electrical connection points and one of the second plurality of connection points, and wherein each conductive path is disposed over the external surface of the first layer, the external surface of the second layer, and an external surface of the third layer.

In some embodiments of the present disclosure, a MEMS device may comprise a plurality of layers, wherein at least one of the plurality of layers comprises one or more MEMS components. The MEMS device may further comprise a first plurality of electrical connection points located at a first planar external surface of a first layer of the plurality of layers and a second plurality of electrical connection points located at a second planar external surface of a second layer of the plurality of layers. The MEMS device may further comprise a plurality of conductive paths over the first planar external surface and the second planar external surface, wherein each conductive path provides a continuous portion of material between one of the first plurality of electrical connection points and one of the second plurality of connection points, and wherein each of the plurality of conductive paths extends along a third planar external planar surface of one or more of the plurality of layers that is located between the first planar external surface and the second planar external surface.

In some embodiments of the present disclosure, a method for operating a MEMS device in an end-use device may comprise receiving, at a first subset of a first plurality of electrical connection points, a plurality of signals from the MEMS device, wherein the MEMS device comprises a plurality of layers, wherein at least one of the plurality of layers comprises one or more MEMS components, and wherein the first plurality of electrical connection points are located at a first planar external surface of a first layer of the plurality of layers. The method may further comprise providing, via a first subset of a plurality of conductive paths, the plurality of signals from the MEMS device to a first subset of a second plurality of electrical connection points, wherein each conductive path provides a continuous portion of material between one of the first plurality of electrical connection points and one of the second plurality of connection points. The method may further comprise receiving, at a second subset of the second plurality of electrical connection points, a plurality of signals from the end-use device, wherein the second plurality of electrical connection points are located at a second planar external surface of a second layer of the plurality of layers. The method may further comprise providing, via the second subset of the plurality of conductive paths, the plurality of electrical signals from the end-use device to a second subset of the first plurality of electrical connection points, wherein, for each of the conductive paths, the continuous portion of material includes a right angle between a respective first electrical connection point and a respective second electrical connection point.

BRIEF DESCRIPTION OF THE DRAWINGS

The above and other features of the present disclosure, its nature, and various advantages will be more apparent upon consideration of the following detailed description, taken in conjunction with the accompanying drawings in which.

DETAILED DESCRIPTION OF DRAWINGS

A MEMS device is fabricated using semiconductor processes and includes a plurality of stacked layers that are bonded together. One or more of the layers include microelectromechanical components that respond to a force of interest (e.g., linear acceleration, angular velocity, pressure, magnetism, ultrasonic forces, etc.) by moving in response to the force and measuring the movement to generate output signals and/or modifying electrical signals in response to the force. The microelectromechanical components are packaged within the other layers of the MEMS device. One or more of the layers of the MEMS device include circuitry that processes signals resulting from the microelectromechanical components (e.g., filtering, scaling, etc.). The resulting output signals are provided to an external surface of the MEMS device to be transmitted to other components of the end-use device for additional processing. In addition, the MEMS device also receives input signals (e.g., power signals, ground, clock signals, control signals for modifying register values, data lines for communicating, etc.). These input signals are received via an external surface of the MEMS device.

In an embodiment of the present disclosure, the layers of the MEMS device may include a MEMS layer including the microelectromechanical components and a cap and substrate layer that encapsulate the MEMS layer. One of these layers may include a plurality of electrical connection points on its external surface from which the input signals are distributed within the MEMS device and to which the output signals are provided from within the MEMS device (e.g., "internal connection points"). Another layer of the MEMS device may include a plurality of electrical connection points for connecting to other components of the end-use device (e.g., "external connection points"). Conductive paths may be formed over the external surface of the MEMS device between the internal connection points and the external connection points.

Each of the conductive paths between the internal connection points and the external connection points may be formed by a single continuous portion of material, such as Copper (Cu), Gold (Au), Nickel (Ni), Cobalt (Co), Tin (Sn), or combinations thereof. The conductive paths may extend along multiple planar surfaces that intersect at angles, such as 90° angles. For example, the conductive paths may extend along a first external planar surface including the internal connection points and be patterned to traverse an angled intersection between the first external planar surface and a second external planar surface. The conductive paths may extend along at least a portion of the second external surface, and in some embodiments, additional angled intersections and external surfaces, to form an electrical connection with the external connection points.

In an embodiment, the internal connection points may be located on a horizontally extending shelf (e.g., in an x-y plane) of the external surface of the substrate layer. The conductive paths may extend along the shelf until the shelf intersects a perpendicular vertical external surface (e.g., in a y-z plane) of the MEMS device (e.g., of the substrate layer or MEMS layer). The conductive paths may extend as continuous portions of material over the 90° angle between the horizontally extending shelf and the vertical external surface and further extend along the vertical external surface in a generally vertical direction (e.g., positive z-axis direction). The vertical external surface may include an external surface of the MEMS layer and, above the MEMS layer, an external surface of the cap layer. The conductive paths may extend over the external surface of the MEMS layer and the external surface of the cap layer (e.g., in the y-z plane perpendicular to the horizontally extending shelf), until they reach an upper external horizontal surface of the cap layer. The upper external horizontal surface of the cap layer may form a perpendicular ledge with the vertical external surface that the conductive paths may extend over (e.g., over an x-y plane of the cap layer parallel to the shelf) as continuous portions of material such that the conductive paths may further extend over the upper external horizontal surface.

The external connection points may be located over the upper external horizontal surface of the cap layer. At least one of the external connection points may provide a ground signal, e.g., that extends into the cap layer. The conductive paths may further extend along the upper external horizontal surface of the cap layer to connect to the external connection points and resulting in continuous portions of conductive material that extend directly between respective internal connection points and external connection points. The external connection points may then be connected to other circuitry of the end-use device. Solder couplings may be formed on the external connection points for direct soldering to external components such as circuit boards that route the input and output signals between the MEMS device to other components of the end-use device. In some embodiments, the solder couplings may be distributed in a particular manner (e.g., evenly distributed or other patterns) to also facilitate the physical connection between the MEMS device and the external components. The solder couplings may thus form both the physical and electrical connection between the MEMS device and other components, such that no other physical connection is needed or the solder couplings form the primary physical connection between the MEMS device and the external circuitry.

Figure 1:
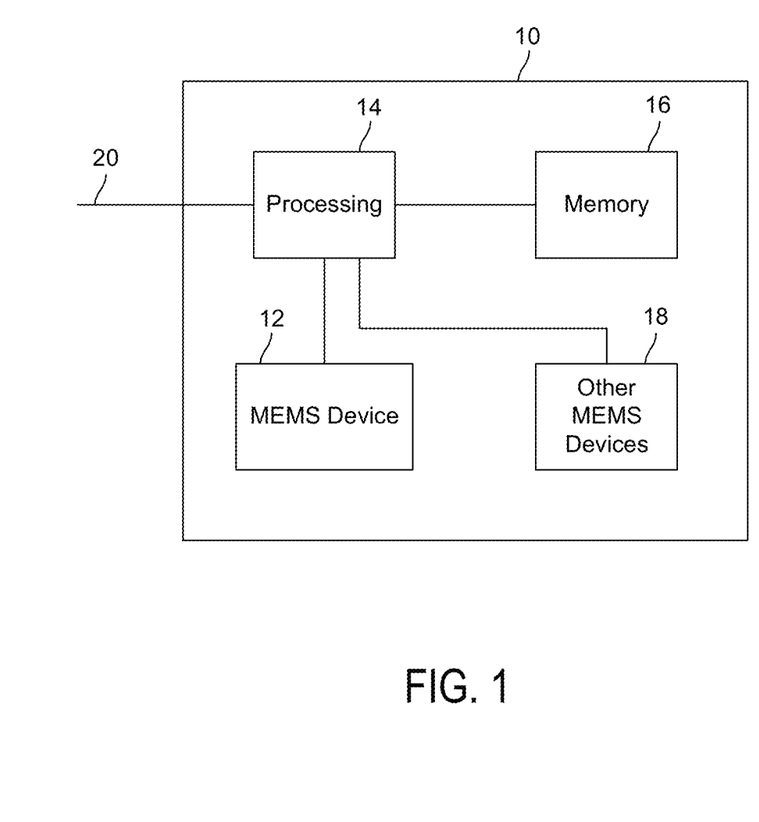
FIG. 1 shows an exemplary motion sensing system in accordance with some embodiments of the present disclosure.

FIG. 1 depicts an exemplary motion sensing system 10 in accordance with some embodiments of the present disclosure. Although particular components are depicted in FIG. 1, it will be understood that other suitable combinations of sensors, processing components, memory, and other circuitry may be utilized as necessary for different applications and systems. In an embodiment as described herein, the motion sensing system may include at least a MEMS device 12 and supporting circuitry, such as processing circuitry 14 and memory 16. In some embodiments, one or more additional MEMS devices 18 (e.g., MEMS gyroscopes, MEMS accelerometers, MEMS microphones, MEMS pressure sensors, and a compass) may be included within the motion processing system 10 to provide an integrated motion processing unit ("MPU") (e.g., including 3 axes of MEMS gyroscope sensing, 3 axes of MEMS accelerometer sensing, microphone, pressure sensor, and compass).

Processing circuitry 14 may include one or more components providing necessary processing based on the requirements of the motion processing system 10. In some embodiments, processing circuitry 14 may include hardware control logic that may be integrated within a chip of a sensor (e.g., on a substrate or cap of MEMS device 12 or other MEMS device 18, or on an adjacent portion of a chip to MEMS device 12 or other MEMS device 18) to control the operation of the MEMS device 12 or other MEMS devices 18 and perform aspects of processing for the MEMS device 12 or other MEMS devices 18. In some embodiments, the MEMS device 12 and other MEMS devices 18 may include one or more registers that allow aspects of the operation of hardware control logic to be modified (e.g., by modifying a value of a register). In some embodiments, processing circuitry 14 may also include a processor such as a microprocessor that executes software instructions, e.g., that are stored in memory 16. The microprocessor may control the operation of the MEMS device 12 by interacting with the hardware control logic, and process signals received from MEMS device 12. The microprocessor may interact with other sensors in a similar manner.

Although in some embodiments (not depicted in FIG. 1), MEMS device 12 or other MEMS devices 18 may communicate directly with external circuitry (e.g., via a serial bus or direct connection to sensor outputs and control inputs), in an embodiment processing circuitry 14 may process data received from MEMS device 12 and other MEMS devices 18 and communicate with external components via communication interface 20 (e.g., a SPI or I2C bus, or in automotive applications, a controller area network (CAN) or Local Interconnect Network (LIN) bus). Processing circuitry 14 may convert signals received from MEMS device 12 and other MEMS devices 18 into appropriate measurement units (e.g., based on settings provided by other computing units communicating over the communication bus 20) and perform more complex processing to determine measurements such as orientation or Euler angles, and in some embodiments, to determine from sensor data whether a particular activity (e.g., walking, running, braking, skidding, rolling, etc.) is taking place.

In some embodiments, certain types of information may be determined based on data from multiple MEMS devices, in a process that may be referred to as sensor fusion. By combining information from a variety of sensors it may be possible to accurately determine information that is useful in a variety of applications, such as image stabilization, navigation systems, automotive controls and safety, dead reckoning, remote control and gaming devices, activity sensors, 3-dimensional cameras, industrial automation, and numerous other applications.

Each MEMS device or a combination of MEMS devices may include microelectromechanical components (e.g., of a MEMS layer) encapsulated between other layers such as a cap layer and substrate layer. For example, a MEMS layer may include microelectromechanical components that respond to the force of interest in a manner that generates signals that are processed by the MEMS device (e.g., by circuitry within a substrate layer such as a CMOS substrate layer or by a bonded processing layer of the MEMS device) to generate output signals such as analog or digital signals representing sensed motion, status signals, data signals, and control signals. The MEMS device is also supplied with input signals from external devices such as power signals, ground, clock signals, register control signals, and data lines.

Figure 2:
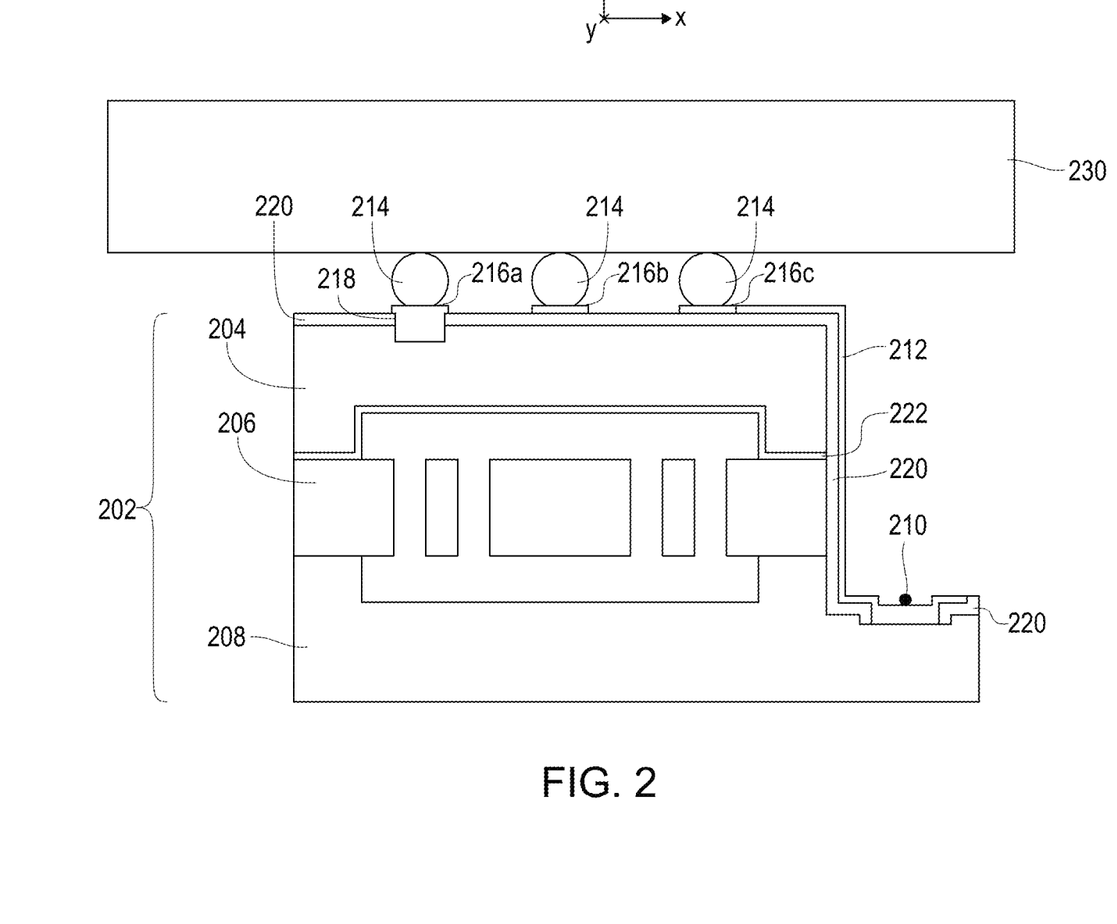
FIG. 2 depicts an exemplary MEMS device having continuous portions of material between connection points in accordance with some embodiments of the present disclosure.

FIG. 2 depicts an exemplary MEMS device having continuous portions of material between connection points in accordance with some embodiments of the present disclosure. Although it will be understood that a MEMS device may include a variety of MEMS device types fabricated with different semiconductor layers, in the exemplary embodiment of FIG. 2, MEMS device 202 may be an inertial MEMS sensor including cap layer 204, MEMS layer 206, and substrate (e.g., CMOS) layer 208. An exemplary inertial MEMS sensor 202 may include movable electromechanical components (e.g., a suspended spring-mass system) within the MEMS layer 206 that are encapsulated within a volume by cap layer 204 and substrate layer 208.

Movement of the electromechanical components may be sensed (e.g., by capacitive sensing, piezoelectric sensing, etc.) and signals corresponding to the movement may be routed on and/or through MEMS sensor 202 to an external surface thereof. In the exemplary embodiment of FIG. 2, the signals may be routed through substrate (e.g., CMOS) layer 208 to an external shelf of substrate layer 208. In some embodiments, processing such as filtering, scaling, A/D conversion, and more complex computations (e.g., orientation, etc., as performed by an embedded ASIC) may be performed within MEMS sensor 202 (e.g., within CMOS substrate layer 208). The sensed and/or processed outputs may be provided to external connection points or bond pads 210, which may be located on a "shelf" of substrate layer 208 that extends beyond the other layers of MEMS sensor 202 within the x-y plane.

In an embodiment of the present disclosure, an isolation layer 220 (e.g., a WPR photoresist) may overlay portions of substrate layer 208 (e.g., of the shelf of the substrate layer and vertically extending portion from the shelf), MEMS layer 206 (e.g., an external-facing portion of the MEMS layer 206), and cap layer 204 (e.g., a top and sides of the cap layer 204). In some embodiments, the isolation layer 220 may include multiple layers and/or different materials at different portions of the external surfaces of the sensor layers 204/206/208, or in some embodiments, there may be no isolation layer 220 or other layer types may be included with or substituted for isolation layer 220.

In an exemplary embodiment of the particular layers and configuration of MEMS sensor 202, continuous portions of material also referred to as a redistribution layer 212 may extend from respective electrical connection points 210 along the x-y plane of the external surface of the shelf of substrate layer 208 generally in the x-direction and traverse a 90° angle between the external x-y planar surface of substrate layer 208 and the external y-z planar surface of substrate layer 208. The continuous portions of material 212 may then extend generally in the z-direction in the y-z planes of the external surfaces of substrate layer 208, MEMS layer 206, and cap layer 204. Once the continuous portions of material 212 encounters the top (along the z-axis) surface of cap layer 204, the continuous portions of material 212 may traverse the 90° angle between the external y-z planar surface of cap layer 204 and the top external x-y planar surface of cap layer 204.

Once over the external x-y planar surface of cap layer 204, the continuous portions of material 212 may extend along the x-y planar surface to respective electrical connection points 216. In the embodiment depicted in FIG. 2, a first continuous portion of material connects to electrical connection point 216a, while second and third continuous portions of material (not depicted) connect to electrical connection points 216a and 216b, respectively. In this manner, direct electrical connections may be made between respective electrical connection points 210 on the external surface of CMOS layer 208 and associated electrical connection points 216 on the external surface of cap layer 204. Electrical connection points 216 may be coupled to other components 230 of an end-use device. In the exemplary embodiment of FIG. 2, solder balls 214 form a soldered connection between other components 230 and cap layer 204 of MEMS sensor 202. Solder balls 214 form direct electrical and physical connections between MEMS sensor 202 and other components 230, providing processed and/or raw outputs from MEMS sensor 202 for use by other systems of the end-use device. The electrical connections provided by solder balls 214 also allow signals to be provided from other components 230 to MEMS sensor 202. Exemplary signals to be provided to MEMS sensor 202 include power signals, ground signals, clock signals, control signals (e.g., register control signals), and data signals exchanged according to a protocol. These signals are in turn distributed to appropriate components of the MEMS package via solder balls 214 to respective external electrical connection points 216, via associated continuous portions of material 212 to external electrical connection points 210, and via substrate (e.g., CMOS) layer 208, to the internal components of MEMS sensor 202. Some signals (e.g., ground and/or power signals) may be provided directly to cap layer 204, as depicted by cap electrical connection 218. In the exemplary embodiment of FIG. 2, the cap layer 204 is insulated from the other layers of the MEMS device 202 by an insulating layer 222 (e.g., an oxide insulating layer).

In comparison to conventional MEMS devices, the exemplary embodiment of FIG. 2 does not require an additional package layer or bonding thereto for electrical or physical connection to the external components. Removing the intermediate package layer reduces the overall size of the packaging of the MEMS sensor, as well as reducing cost and removing fabrication steps. In addition, because the continuous portions of material are fabricated directly over the external non-conductive surfaces of the layers of the MEMS sensor, there is no need for wirebond connections between any layers of the MEMS sensor. Further, the continuous portions of material are patterned and located such that they will not come into contact with each other and are unlikely to come into contact with other external conductive components. An additional insulating layer may also be formed directly over the continuous portions of material. Accordingly, epoxy is not required for securing and protecting wirebonds. Removing this additional material reduces the overall size of the sensor, reduces cost, and eliminates manufacturing steps. The reduced size and weight of the MEMS sensor of FIG. 2 allows the MEMS sensor to be placed in ever-smaller environments with more precision. Further, the direct connection by the solder couplings to the cap layer securely attach the MEMS sensor to the other components. In combination with the reduced height and profile of the MEMS sensor, the forces imparted on the solder coupling are substantially reduced.

The external surfaces of the layers of MEMS sensor 202 may be non-conductive and in some embodiments additional layers of non-conductive material (e.g., a photo-resist layer 220) may be deposited on the external surfaces of MEMS sensor 202 that have the continuous portions of material fabricated thereon (e.g., a photo-resist 220 patterned on the x-y shelf and adjacent y-z planar surface of substrate layer 208, y-z planar surface of MEMS layer 206, and y-z planar surface and adjacent x-y planar surface of cap layer 204). Exemplary materials for the continuous portions of material include Copper (Cu), Gold (Au), Nickel (Ni), Cobalt (Co), or Tin (Sn), and Aluminum (Al).

Figure 3:
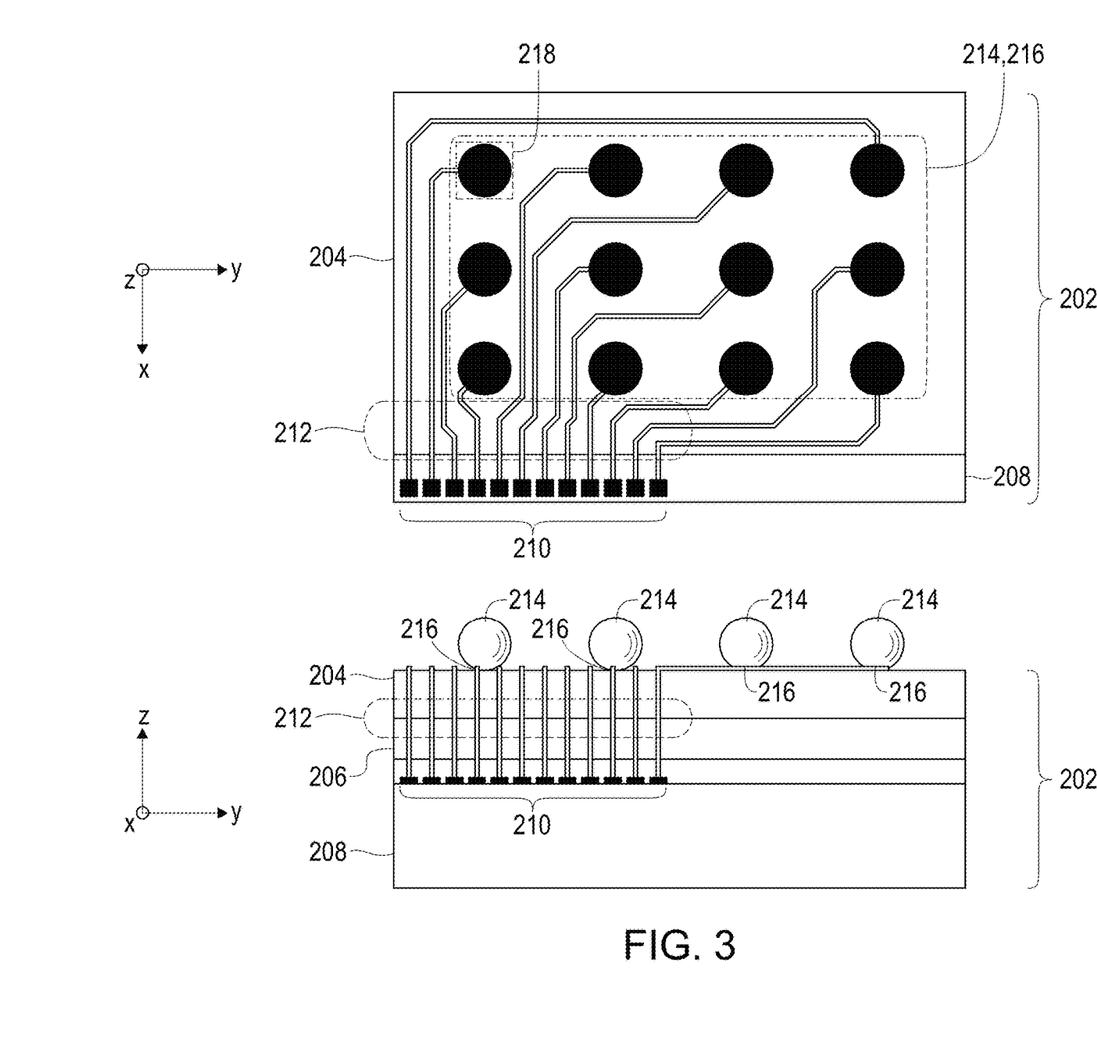
FIG. 3 depicts exemplary top and front views of the exemplary MEMS device of FIG. 2 in accordance with some embodiments of the present disclosure.
Figure 4:
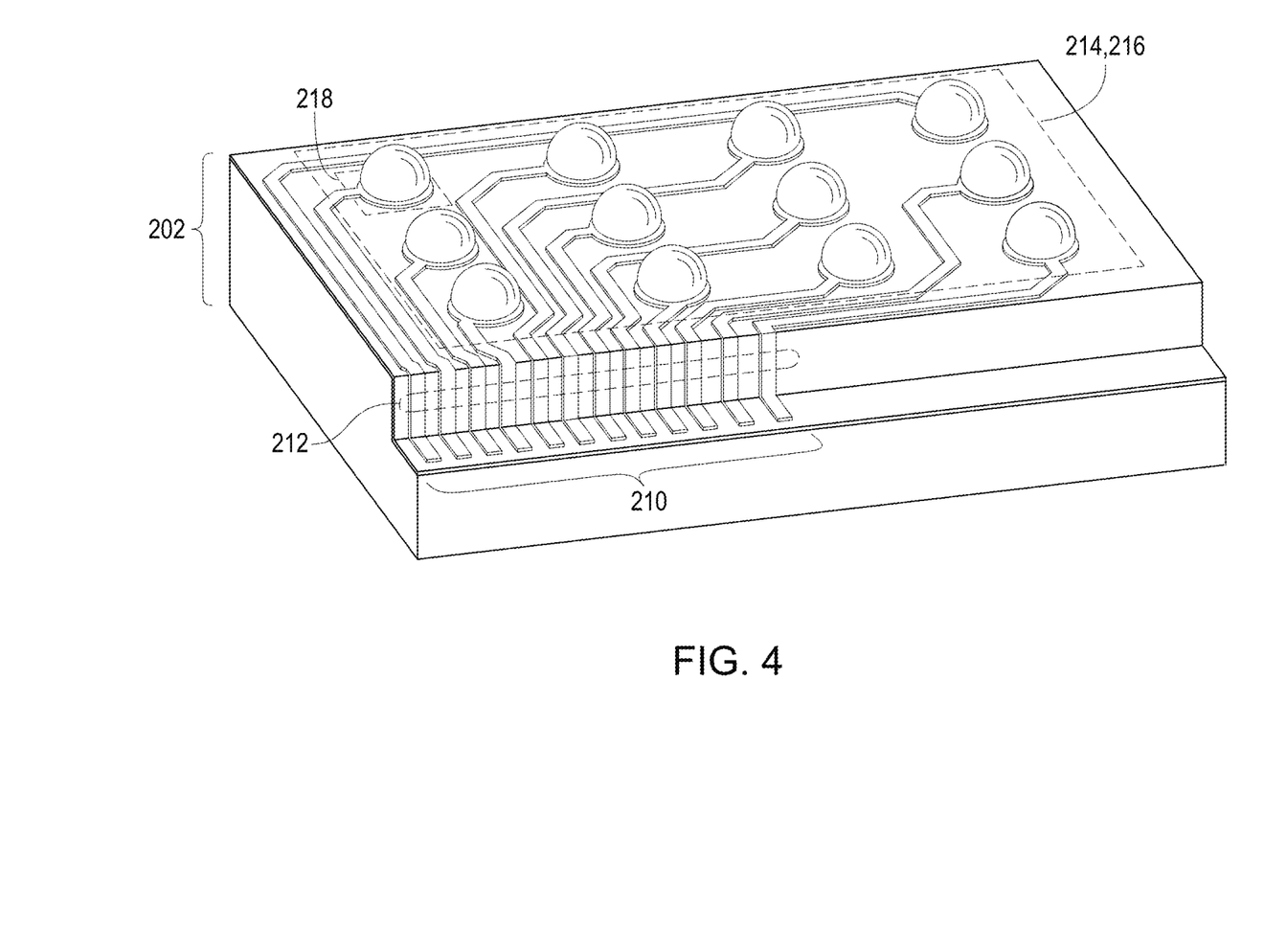
FIG. 4 depicts an exemplary perspective view of the exemplary MEMS device of FIGS. 2-3 in accordance with some embodiments of the present disclosure.

Although FIG. 2 and FIGS. 3-4 herein are described in the context of a particular MEMS device type and configuration, the disclosure of the present application may apply to a variety of different applications. In addition to MEMS sensors, the present disclosure may be applied to any suitable MEMS device. Moreover, while the substrate layer is described herein as the layer that provides electrical connection between the external connection points and the internal components of the MEMS sensor, such electrical connections and connection points may be provided on other layers and/or multiple layers of a MEMS sensor. Furthermore, additional layers (e.g., an ASIC processing layer bonded to the substrate layer) may be provided in addition to the 3-layer MEMS sensor described herein. In some embodiments, more than two layers may include electrical connection points. For example some continuous portions of material may provide direct electrical connections only between layers of the MEMS sensor, while some continuous portions of material may provide direct electrical connections to the external components. Different configurations of layers may have no shelf or multiple shelfs, and in some embodiments, transitions between planar surfaces may be at angles other than 90°.

FIG. 3 depicts exemplary top and front views of the exemplary MEMS device of FIG. 2 in accordance with some embodiments of the present disclosure. In the exemplary embodiment of FIG. 3, first electrical connection points 210 are configured in a single uniform row on the shelf of substrate layer 208. In some embodiments, other configurations including multiple rows of electrical connection points, an even distribution of electrical connection points, and other patterns may be utilized (e.g., to correspond with associated components within MEMS sensor 202). The continuous portions of material 212 are connected to a respective one of the electrical connection points 210 and extend along the x-y plane of substrate layer 208 in the direction of the y-z vertical planar surface of substrate layer 208. Although in the exemplary embodiment of FIG. 3 the continuous portions of material 212 extend along the x-y planar external surface of substrate 208 solely in the x-direction, in other embodiments (e.g., based on respective locations of electrical connection points 210) the continuous portions of material 212 may extend within the x-y plane in both the x-direction and y-direction.

The continuous portions of material 212 traverse a 90° angle between the external x-y planar surface of substrate layer 208 and the external y-z planar surface of substrate layer 208. In the exemplary embodiment of FIG. 3, the continuous portions of material 212 may then extend in the z-direction over the y-z planar external surfaces of substrate layer 208, MEMS layer 206, and cap layer 204, until reaching the top x-y external surface of the cap layer. In some embodiments (not depicted in FIG. 3), the continuous portions of material 212 may extend in both the y-direction and z-direction while generally extending in the z-direction, for example, to require less travel along the x-y planar external surface of cap layer 204 to connect to electrical connection points 216.

The continuous portions of material 212 traverse a 90° angle between the external y-z planar surface of cap layer 204 and the external x-y planar surface of cap layer 204. In the exemplary embodiment of FIG. 3, electrical connection points 216 and solder balls 214 connected thereto may be evenly distributed about the top x-y external planar surface of cap 204. In other embodiments (not depicted in FIG. 3), electrical connection points 216 and solder couplings (e.g., solder balls 214) may be distributed in other patterns for desired electrical and physical connections, for example, with a substantial percentage of the electrical connection points 216 and solder balls 214 near corners of the MEMS sensor 202, along the exterior of the MEMS center, bunched near the center of MEMS sensor 202, or distributed to correspond to preexisting connection points of the other components of the end use device. In this manner, the particular pattern of electrical connection points 216 and solder balls 214 may be customized to particular applications, MEMS sensor shapes/sizes, and expected stresses incurred from the other components. Although the present disclosure may generally refer to solder couplings (e.g., solder balls) as forming the electrical and physical connections between the electrical connection points of the MEMS device and the other components, it will be understood that other electromechanical methods of forming conductive physical connections between components may be utilized.

As depicted in FIG. 3, the continuous portions of material 212 may extend along the x-y planar surface of cap layer 204 to respective electrical connection points 216. In this manner, direct electrical connections may be made between respective electrical connection points 210 on the external surface of CMOS layer 208 and associated electrical connection points 216 on the external surface of cap layer 204. Paths for the continuous portions of material 212 over the top x-y planar external surface may be selected on a number of bases, including based on respective y-axis locations where the continuous portion of material extends from the y-z external planar surface of cap layer 204 to the x-y planar surface of cap layer 204, locations of electrical connection points 216, and desired electrical and RF characteristics, such as avoiding undesired RF emissions or functioning as a shield to electromagnetic interference sources.

FIG. 4 depicts an exemplary perspective view of the exemplary MEMS device of FIGS. 2-3 in accordance with some embodiments of the present disclosure. The perspective view of FIG. 5 demonstrates the completed MEMS sensor 202 before connection to the other components via solder balls 214. The layers of the MEMS sensor 202 are not visible, as additional layers such as a photo-resist layer have been applied to the external surfaces of the MEMS sensor prior to application of the continuous portion of material 212.

Figure 5:
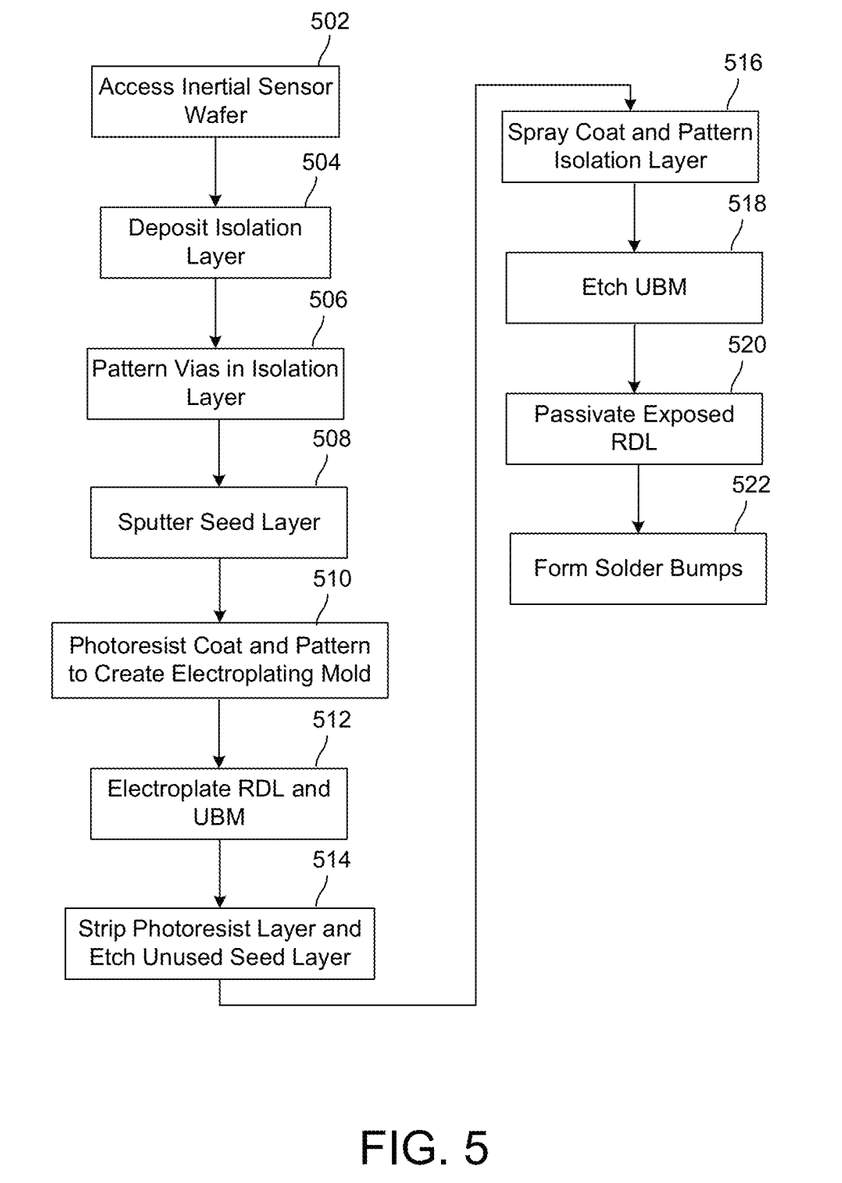
FIG. 5 depicts exemplary steps for fabricating a MEMS device having continuous portions of material between connection points in accordance with some embodiments of the present disclosure.

FIG. 5 depicts exemplary steps for fabricating a MEMS device having continuous portions of material between connection points in accordance with some embodiments of the present disclosure. Although FIG. 5 is described in the context of the present disclosure, it will be understood that the methods and steps described in FIG. 5 may be applied to a variety MEMS designs having direct electrical connections, sensing element types, processing circuitry, and measurement techniques. Although a particular order and flow of steps is depicted in FIG. 5, it will be understood that in some embodiments one or more of the steps may be modified, moved, removed, or added, and that the flow depicted in FIG. 5 may be modified.

At step 502, a wafer of MEMS devices (e.g., MEMS inertial sensors) may be accessed. In an exemplary embodiment, the wafer may have previously undergone processing to fabricate and bond the respective layers (e.g., cap layer, MEMS layer, and CMOS layer) of the MEMS device and may include locations for placement of electrical connection points.

At step 504, an isolation layer (e.g., WPR photoresist) may be deposited by spray coating on exposed surfaces of the MEMS devices of the wafer. In an exemplary embodiment, the substrate (e.g., CMOS) layer of the MEMS device may be located at the lower surface of the wafer with the MEMS layer and cap layer located at progressively greater distances from the lower surface. The exposed surfaces may include any exposed portions of these layers, including, for example, a horizontal shelf of the substrate layer, vertical surfaces of all three layers, and an upper horizontal surface of the cap layer.

At step 506, the isolation layer may be patterned to create trenches in the isolation layer. The trenches may expose one or more locations such as electrical connection points of the substrate (e.g., CMOS layer) and cap layers and/or provide locations for conductive paths between electrical connection points, as well as other sensor portions such as a ground plane of a cap layer. In an exemplary embodiment, only a subset of the electrical connection points requiring direct access to the surface of the MEMS device (e.g., at a shelf of a substrate layer and/or a subset of electrical connection points of the cap layer) may be patterned.

At step 508, a seed layer (e.g., a Ti/Cu seed layer) may be applied (e.g., sputtered) over the isolation layer and exposed portions of the MEMS device (i.e., the trenches). At step 510, an electroplating photo resist mold may be applied, for example, by spray coating. The electroplating photo resist is later patterned. In an exemplary embodiment, the spray coating may cover the seed layer and isolation layer, and the patterning of the electroplating photoresist may correspond to the locations of the electrical connection points and the conductive paths therebetween. As a result of the creation of the electroplating mold, some electrical connection points (e.g., for a shelf of a substrate layer and power supply to a cap layer) may be exposed through the isolation layer (applied at step 504) and some electrical connection points and conductive paths (e.g., electrical connection points of the cap layer and conductive paths that that connect between other devices and the electrical connection points of the substrate layer) may be patterned over the isolation layer.

At step 512, a redistribution layer (e.g., conductive paths of continuous portions of material 212 such as a Cu/Ni layer) followed by electrical connection points 210 and 216 (e.g., an under-bump metallization layer such as Au) may be electroplated in the patterned locations of the electroplated mold to form and electrically connect the electrical connection points and conductive paths (i.e., continuous portions of material) between the electrical connection points.

At step 514, the photoresist applied at step 510 may be stripped and unused portions of the seed layer (e.g., not having the redistribution layer and under-bump metallization layer applied over the seed layer) may be etched, exposing the isolation layer, redistribution layer, and under-bump metallization layer.

At step 516, an additional isolation (e.g., photoresist) layer may be spray coated over the exposed layers and patterned, e.g., to facilitate exposure of the connections points 210 and 216 (e.g., under-bump metallization). At step 518, the connections points 210 and 216 (e.g., under-bump metallization) may be etched. At step 520, the any exposed portions of the conductive paths (e.g., redistribution layer) may be electrically passivated (e.g., using plasma). At step 522, electrical connections such as solder bumps may then be formed over the exposed connection points (e.g., under-bump metallization of the cap), providing physical and electrical connections to other components. The wafers may then be diced to create the individual MEMS devices for integration with the other components in an end use device.

The foregoing description includes exemplary embodiments in accordance with the present disclosure. These examples are provided for purposes of illustration only, and not for purposes of limitation. It will be understood that the present disclosure may be implemented in forms different from those explicitly described and depicted herein and that various modifications, optimizations, and variations may be implemented by a person of ordinary skill in the present art, consistent with the following claims.

What is claimed is:
1. A microelectromechanical (MEMS) device, comprising:
a first layer;
a second layer;

a third layer coupled between the first layer and the second layer, wherein the third layer comprises one or more MEMS components;

a first plurality of electrical connection points located at an external surface of the first layer;

a second plurality of electrical connection points located at an external surface of the second layer, wherein at least one of the second plurality of electrical connection points is in direct electrical connection with the second layer; and a plurality of conductive paths, wherein each conductive path provides a continuous portion of material between one of the first plurality of electrical connection points and one of the second plurality of electrical connection points, and wherein each conductive path is disposed over the external surface of the first layer, the external surface of the second layer, and an external surface of the third layer.

2. The MEMS device of claim 1, wherein the second plurality of electrical connection points comprises a plurality of solder couplings.

3. The MEMS device of claim 2, wherein the second external surface is perpendicular to the third external surface.

4. The MEMS device of claim 2, further comprising one or more external components coupled to the plurality of solder couplings.

5. The MEMS device of claim 4, wherein the plurality of solder couplings electrically connects the first plurality of electrical connections to the one or more external components.

6. The MEMS device of claim 5, wherein the first plurality of electrical connections is not electrically connected to any external components other than the one or more external components electrically connected via the plurality of solder couplings.

7. A microelectromechanical (MEMS) device, comprising:

a first layer;

a second layer;

a third layer coupled between the first layer and the second layer, wherein the third layer comprises one or more MEMS components;

a first plurality of electrical connection points located at an external surface of the first layer;

a second plurality of electrical connection points located at an external surface of the second layer; and a plurality of conductive paths, wherein each conductive path provides a continuous portion of material between one of the first plurality of electrical connection points and one of the second plurality of electrical connection points, wherein each conductive path is disposed over the external surface of the first layer, the external surface of the second layer, and an external surface of the third layer, wherein the first layer comprises electrical circuitry, wherein the external surface of the first layer comprises a shelf that extends beyond the second layer and the third layer, and wherein the first plurality of electrical connection points are located at the shelf.

8. The MEMS device of claim 7, wherein the first plurality of electrical connection points are bond pads.

9. The MEMS device of claim 8, wherein a plurality of signals is received at the bond pads via the first layer.

10. The MEMS device of claim 9, wherein a surface of the shelf including the conductive material is parallel to the external surface of the second layer.

11. The MEMS device of claim 10, wherein the surface of the shelf including the conductive material and the external surface of the second layer are perpendicular to the third external surface.

12. The MEMS device of claim 9, wherein the second plurality of electrical connection points comprise a plurality of solder couplings.

13. The MEMS device of claim 12, further comprising one or more external components coupled to the plurality of solder couplings.

14. The MEMS device of claim 13, wherein the plurality of solder couplings electrically connect the first plurality of electrical connections to the one or more external components.

15. A microelectromechanical (MEMS) device, comprising:

a first layer;

a second layer;

a third layer coupled between the first layer and the second layer, wherein the third layer comprises one or more MEMS components;

a first plurality of electrical connection points located at an external surface of the first layer;

a second plurality of electrical connection points located at an external surface of the second layer; and a plurality of conductive paths, wherein each conductive path provides a continuous portion of material between one of the first plurality of electrical connection points and one of the second plurality of electrical connection points, wherein each conductive path is disposed over the external surface of the first layer, the external surface of the second layer, and an external surface of the third layer, and wherein the second and third layers are electrically isolated from each other.

16. The MEMS device of claim 15, wherein an oxide insulating layer isolates the second layer from the third layer.

17. The MEMS device of claim 15, wherein the first and third layers are electrically connected.

18. The MEMS device of claim 17, wherein the second plurality of electrical connection points comprise a plurality of solder couplings.

19. The MEMS device of claim 18, further comprising one or more external components coupled to the plurality of solder couplings.

20. The MEMS device of claim 19, wherein the plurality of solder couplings electrically connect the first plurality of electrical connections to the one or more external components.

* * * * *